(12) United States Patent
Marokkey

(10) Patent No.: US 7,807,320 B2
(45) Date of Patent: Oct. 5, 2010

(54) OVERLAY TARGET FOR POLARIZED LIGHT LITHOGRAPHY

(75) Inventor: Sajan Marokkey, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/470,154

(22) Filed: May 21, 2009

(65) Prior Publication Data

US 2009/0233191 A1    Sep. 17, 2009

Related U.S. Application Data

(62) Division of application No. 11/218,417, filed on Sep. 1, 2005, now Pat. No. 7,556,898.

(51) Int. Cl.
*G03F 9/00* (2006.01)
(52) U.S. Cl. .............................................. 430/5; 430/22
(58) Field of Classification Search ..................... 430/5, 430/22
See application file for complete search history.

(56) References Cited

U.S. PATENT DOCUMENTS 5,245,470 A    9/1993    Keum 6,079,256 A    6/2000    Bareket
6,525,818 B1   2/2003    Yin et al.
6,921,916 B2   7/2005    Adel et al.

FOREIGN PATENT DOCUMENTS

| JP | 05-109601 A  | 4/1993 |
| JP | 05-188576    | 7/1993 |
| JP | 07-248208 A  | 9/1995 |
| JP | 2000-010254 A | 1/2000 |
| JP | 2001-093820 A | 4/2001 |

OTHER PUBLICATIONS

Brunner, T.A., "Impact of Lens Aberrations on Optical Lithography", IBM Journal of Research and Development, 1997, 14 pages, vol. 41, Nos. ½, http://researchweb.watson.ibm.com/journal/rd/411/brunner.html, downloaded Aug. 30, 2005.

*Primary Examiner*—Christopher G Young
(74) *Attorney, Agent, or Firm*—Slater & Matsil, L.L.P.

(57) ABSTRACT

A target and method for use in polarized light lithography. A preferred embodiment comprises a first structure located on a reference layer, wherein the first structure is visible through a second layer, and a second structure located on the second layer, wherein the second structure is formed from a photomask containing a plurality of sub-structures oriented in a first orientation, wherein a polarized light is used to pattern the second structure onto the second layer, and wherein a polarization of the polarized light is the same as the orientation of the plurality of sub-structures. The position, size, and shape of the second structure is dependent upon a polarity of the polarized light, permitting a single design for an overlay target to be used with different polarities of polarized light.

20 Claims, 5 Drawing Sheets

OVERLAY TARGET FOR POLARIZED LIGHT LITHOGRAPHY

This is a divisional application of U.S. application Ser. No. 11/218,417, which was filed on Sep. 1, 2005 now U.S. Pat. No. 7,556,898 and is incorporated herein by reference.

TECHNICAL FIELD

The present invention relates generally to integrated circuit wafer fabrication, and more particularly to an overlay target and a method for use in polarized light lithography.

BACKGROUND

The fabrication of integrated circuits on semiconductor wafers typically involves the creation of multiple, successive layers of materials, such as insulators, conductors, semiconductors, and so forth, on the semiconductor wafers. Each of the layers is normally formed by applying a photoresist layer over previously formed layers and then the photoresist layer is patterned. Portions of the photoresist layer not exposed during the patterning can be washed off and the layer can be formed using one of many desired techniques. When completed properly, the multiple layers combine to form functional integrated circuits. The alignment of the individual layers is crucial to creating properly formed structures in the semiconductor wafer. Misalignment of the layers can reduce the performance of the integrated circuitry if the misalignment is small (due to improper device geometries) and inoperable integrated circuitry if the misalignment is large (due to formation of improper electrical connections).

Misalignment of the layers can arise when a photomask is used to pattern a layer and the photomask is not lined up properly with previously created layers on the semiconductor wafer. Misalignment can be due to mechanical shift errors, optical lens magnification errors, optical lens aberration errors, and so forth. Mechanical shift errors can be the result of shifts in the semiconductor wafer and/or the photomask during processing and optical lens magnification errors can be a result of magnification mismatches between different layers of the semiconductor wafer. Optical lens aberration errors can be the result of non-ideal characteristics of an optical lens being used, wherein light passing through the lens behaves differently depending upon the portion of the lens the light is passing through.

Overlay targets have been used to allow for the alignment of the individual layers of a semiconductor wafer. After a photoresist layer has been patterned (and before the actual layer has been created) on top of the semiconductor wafer, which can have one or more targets, an optical system, such as a part of an overlay metrology tool, can capture images of the targets along with corresponding bullets (a part of the photoresist layer corresponding to the overlay target) in the photoresist layer and optical analysis algorithms can determine if the photoresist layer is aligned within specifications with respect to the semiconductor wafer. If the photoresist layer being created is determined to be misaligned, the photoresist layer can be removed, usually using a chemical wash, and a new photoresist layer can be applied and patterned and the optical processing can be repeated until the photoresist layer becomes aligned.

One disadvantage of the prior art is that the overlay targets can be used to detect mechanical shift errors and lens magnification errors. However, lens aberrations can also result in significant misalignment errors and the prior art overlay targets do not adequately capture lens aberration errors.

A second disadvantage of the prior art is that the overlay targets do not exploit the advantages of using polarized light.

Yet another disadvantage of the prior art is that the overlay targets typically comprise the photoresist layer and a layer immediately beneath it. The use of adjacent layers can permit a sequential build-up of misalignment that, while between the adjacent layers is within specifications, can lead to an overall misalignment that exceeds specifications.

SUMMARY OF THE INVENTION

These and other problems are generally solved or circumvented, and technical advantages are generally achieved, by preferred embodiments of the present invention which provides an overlay target and a method for use in polarized light lithography.

In accordance with a preferred embodiment of the present invention, an overlay target for use in aligning layers of a semiconductor wafer is provided. The overlay target includes a first structure located on a reference layer and a second structure located on a second layer. The first structure is visible through the second layer. The second structure is formed from a photomask containing a plurality of sub-structures, with all sub-structures in the plurality of sub-structures oriented in a first orientation. A polarized light is used to pattern the second structure onto the second layer and the polarized light has a polarization that is the same as the first orientation.

In accordance with another preferred embodiment of the present invention, a mask for forming a bullet portion of an overlay target is provided. The mask includes a first structure and a second structure. The first structure includes a first plurality of sub-structures, all oriented along a first orientation. The second structure includes a second plurality of sub-structures, all oriented along a second orientation. The second orientation is different from the first orientation.

In accordance with another preferred embodiment of the present invention, a method for aligning a photomask is provided. The method includes applying a polarized light with a specific orientation on the photomask to pattern a photoresist layer on a semiconductor substrate, determining an alignment by processing image data of structures on the photoresist layer and a structure on a reference layer. The method further includes if the photomask and the reference layer are misaligned, stripping the photoresist layer and moving the photomask. At least one of the structures on the photomask becomes opaque to the polarized light if the specific orientation of the polarized light is orthogonal to an orientation of the structures on the photomask.

An advantage of a preferred embodiment of the present invention is that the overlay target can be used to measure layer misalignments due to mechanical shifts, lens magnification errors, and lens aberration errors.

A further advantage of a preferred embodiment of the present invention is that the overlay target can be used with a single reference layer. This can simplify overlay target design and use. Furthermore, the use of a single reference layer can result in more accurate layer alignment since layer misalignment is not allowed to build up through successive layers.

Yet another advantage of a preferred embodiment of the present invention is that the overlay target can be used with layers formed with both horizontal and vertical polarized light. This can simplify overlay target design and use since a single overlay target can be used, rather than requiring multiple overlay target designs.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely semiconductor fabrication using polarized light lithography. The invention may also be applied, however, to other semiconductor fabrications techniques involving lithography, including those using non-polarized light.

Figure 1A:
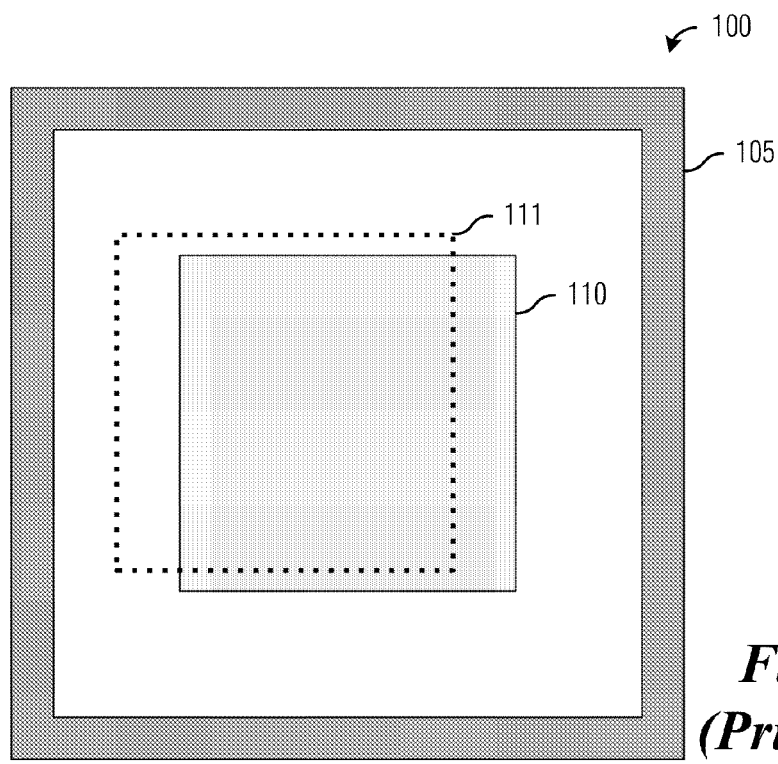
FIGS. 1a and 1b are diagrams of prior art overlay targets.
Figure 1B:
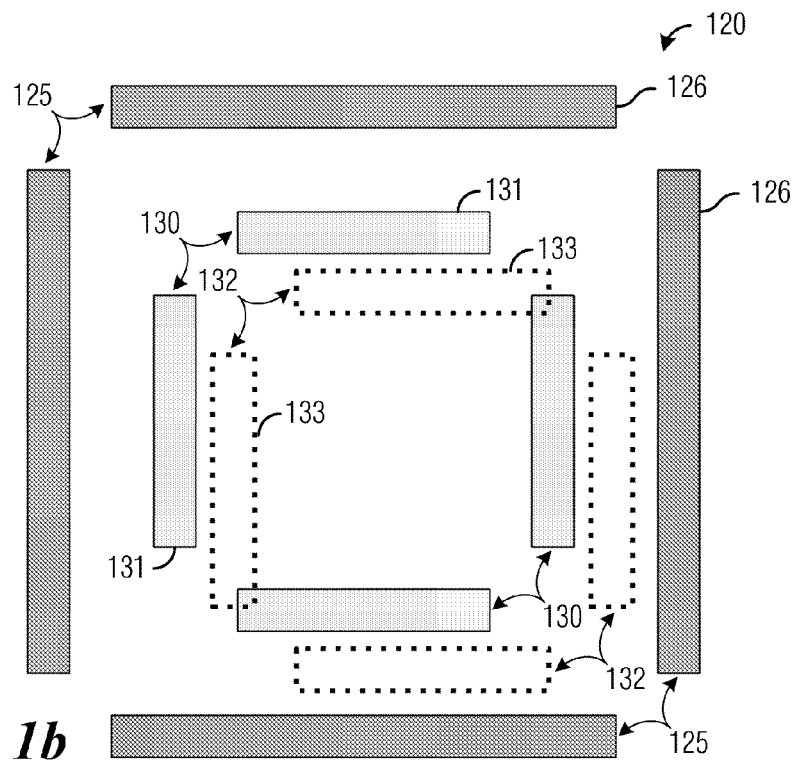

With reference now to FIGS. 1a and 1b, there are shown diagrams illustrating exemplary prior art overlay targets. The diagram shown in FIG. 1a illustrates a first prior art overlay target 100. The first overlay target 100 comprises a frame 105 formed on a first layer and a box 110 formed on a second layer. The box 110 is commonly referred to as a bullet. If the first layer and the second layer were perfectly aligned, the box 110 would be centered (both horizontally and vertically) inside the frame 105. Any misalignment present between the first layer and the second layer would result in the box 110 not being centered inside the frame 105, such as shifted box 111, which shows that the second layer has been shifted to the left and slightly up with respect to the first layer. The diagram shown in FIG. 1b illustrates a second prior art overlay target 120. The second overlay target 120 comprises an incomplete outer frame 125 made up of four sides 126 formed on a first layer and an incomplete inner frame 130 made up of four sides 131. Similar to the first prior art overlay target 100, if the first layer and the second layer were aligned properly, then the incomplete outer frame and the incomplete inner frame would be centered. A shifted incomplete inner frame 132 made up of four sides 133 shows that the second layer has been shifted to the left and down with respect to the first layer.

There are many algorithms using optical image processing techniques that can be used to determine if layers are misaligned using overlay targets. These algorithms either make use of image (intensity) based techniques or diffraction based techniques to determine the presence of misalignment between layers. Image based techniques involve capturing an image of the overlay target and then applying an algorithm to process the image to determine the positional relationship of components of the overlay target, such as the frame 105 and the box 110 of the overlay target 100 (FIG. 1a). Diffraction based techniques involve a scanning of the overlay target with a light source, typically a laser, and capturing scattered light. An algorithm can then be used to process the scattered light and determine the positional relationship of components in the overlay target. The algorithms and techniques used to determine misalignment are considered to be well understood by those of ordinary skill in the art of the present invention and will not be discussed further herein.

The use of immersion technology, wherein a liquid with desired optical properties is placed between imaging equipment and the semiconductor wafer, has permitted conventional lithography to create integrated circuit feature sizes on the order of 40 nanometers and below without having to shorten the wavelength of the light used in the lithography process. When polarized light is used, additional imaging contrast can be provided to increase the depth of field and permit the formation of even smaller feature sizes.

Figure 2:
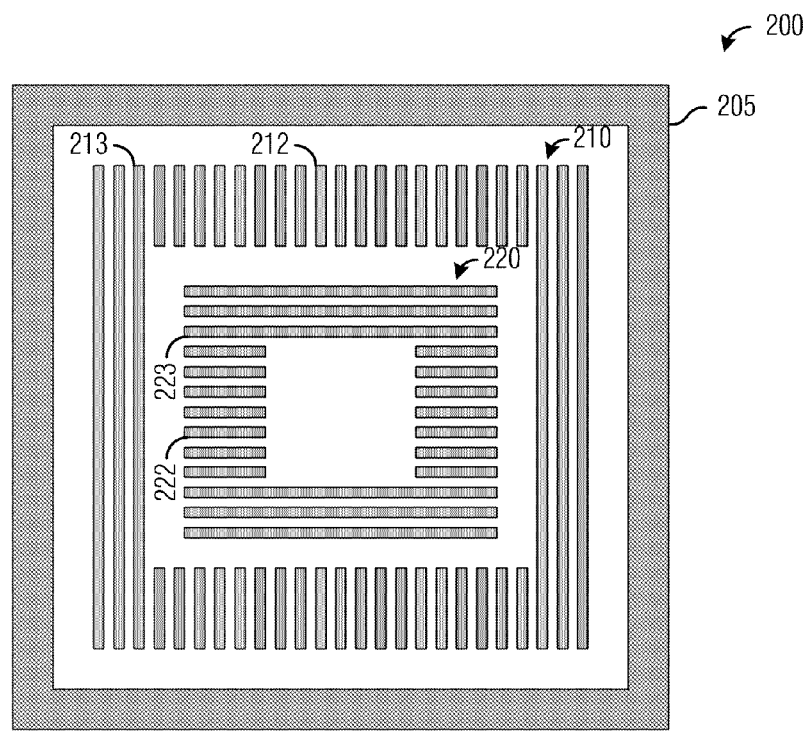
FIG. 2 is a diagram of a composite mask for forming an overlay target, according to a preferred embodiment of the present invention.

With reference now to FIG. 2, there is shown a diagram illustrating a composite mask for forming an overlay target 200 for use in the fabrication of integrated circuits using polarized light lithography, according to a preferred embodiment of the present invention. The composite mask can illustrate portions of photomasks used to create different layers of the integrated circuit in a single diagram to simplify discussion. The composite mask shows an overlay target 200 comprising a frame 205 that can be formed on a reference layer. The portion of a photomask used to form the frame 205 may be a part of a photomask that is used to pattern photoresist used to form the reference layer.

The frame 205 may be formed on a first layer created on a semiconductor substrate. If formed with the first layer, there is little possibility of misalignment. The composite mask of the overlay target 200 also comprises a first inner frame 210 and a second inner frame 220. The first inner frame 210 and the second inner frame 220 comprise the bullet portion of an overlay target. The first inner frame 210 can be formed from a plurality of vertically oriented components, such as a short vertical component 212 and a long vertical component 213. The second inner frame 220 can be formed from a plurality of horizontally oriented components, such as a short horizontal component 222 and a long horizontal component 223. The components forming the first inner frame 210 and the components forming the second inner frame 220 should be aligned so that they are orthogonal with respect to one another. Although the diagram illustrates the first inner frame 210 being formed from vertical components and the second inner frame 220 being formed from horizontal components, the first inner frame 210 may be formed from horizontal components and the second inner frame 220 may be formed from vertical components without affecting the scope or spirit of the present invention.

The frame 205 can be formed on a reference layer, for example, a first layer formed on the semiconductor wafer, and can be used for the formation of subsequent layers, for example, layer two, layer three, layer four, and so forth. Alternatively, the frame 205 can be formed on a layer immediately preceding a layer to be formed. For example, the frame 205 can be formed on layer three and the layer to be formed will be formed on layer four.

Depending upon a polarization of the light used in the polarized light lithography, either the first inner frame 210 or the second inner frame 220 will be patterned onto a photoresist layer, with the orientation of the components of the first inner frame 210 and the second inner frame 220 blocking the polarized light if the polarization of the polarized light is orthogonal to their own orientation. For example, if the polarized light is oriented vertically, then the first inner frame 210 is patterned onto the photoresist layer since the orientation of the second inner frame 220 blocks the polarized light from illuminating the photoresist layer. Therefore, the overlay target for the layer using vertically oriented polarized light would comprise the frame 205 and the first inner frame 210. An optical image processing system would then capture an image of the overlay target 200 and execute image processing algorithms on the captured image data to determine if the layers are properly aligned. The use of horizontally oriented polarized light (vertically oriented polarized light) in conjunction with horizontally oriented structures (vertically oriented structures) is referred to as TE polarization or S polarization.

According to a preferred embodiment of the present invention, dimensions (such as width and pitch) of the components of the first inner frame 210 and the second inner frame 220 should be kept close to design rules of the layer being patterned. For example, for use in patterning a poly layer in a 45 nanometer fabrication process, the components should have a width of about 60 nanometers and a pitch of about 140 nanometers. The width and/or pitch of the components can differ depending upon the layer being patterned as well as the fabrication technology.

Figure 3A:
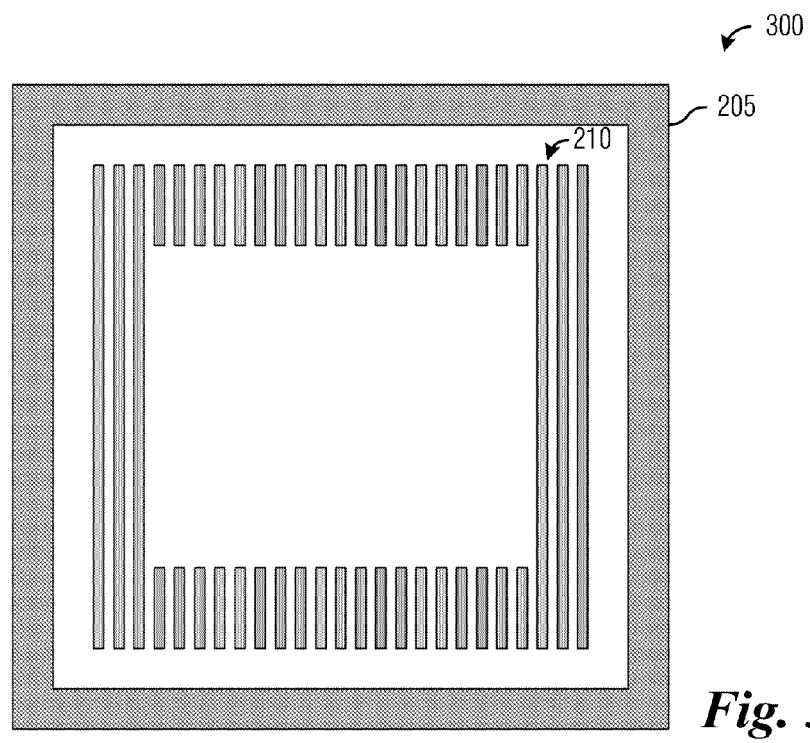
FIGS. 3a through 3c are diagrams of the overlay target of FIG. 2 as created on multiple layers of an integrated circuit, according to a preferred embodiment of the present invention.
Figure 3B:
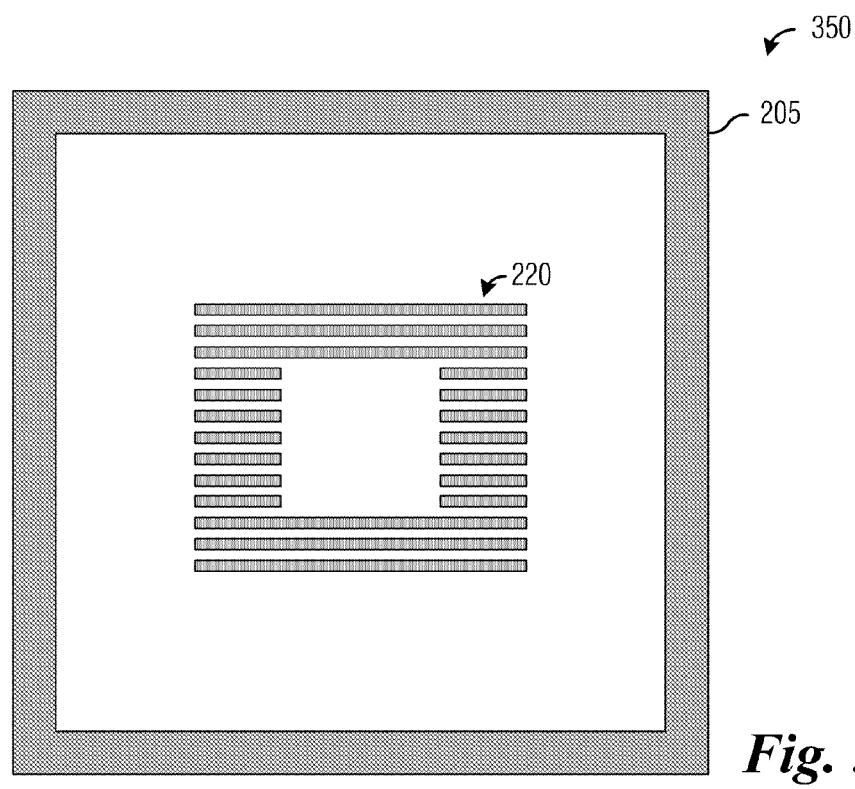
Figure 3C:
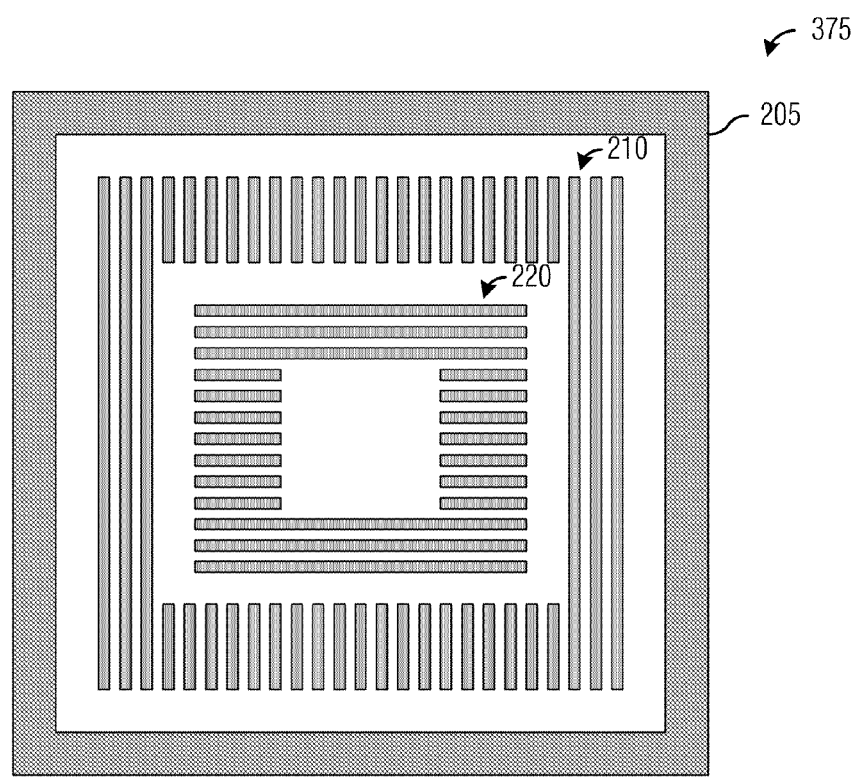

With reference now to FIGS. 3a through 3c, there are shown diagrams illustrating views of the overlay target 200 (FIG. 2) created with polarized light of different orientations, according to a preferred embodiment of the present invention. The diagram shown in FIG. 3a illustrates a view 300 of the overlay target 200 when polarized light with a vertical orientation is used in the patterning of a layer. When vertically oriented polarized light is used with the overlay target 200, the view 300 is seen by optical processing equipment used to align layers. The optical processing equipment sees the frame 205 and the first inner frame 210 with its vertical components since the second inner frame 220 was not patterned. The diagram shown in FIG. 3b illustrates a view 350 of the overlay target 200 when polarized light with a horizontal orientation is used in the patterning of a layer. When horizontally oriented polarized light is used with the overlay target, the view 350 is seen by optical processing equipment used to align layers. The optical processing equipment sees the frame 205 and the second inner frame 210 with its horizontal components.

If unpolarized light (or polarized light with an orientation other than vertical or horizontal) were used in the patterning of a layer, then the optical processing equipment would see both the first inner frame 210 and the second inner frame 220 as well as the frame 205, since both the first inner frame 210 and the second inner frame 220 would have been patterned onto the photoresist. The presence of both inner frames does not necessarily hurt the performance of the alignment process, although additional compensation may need to take place to properly process the additional optical information.

Additionally, both horizontally oriented and vertically oriented light can be used in the patterning of a layer. A view 375, shown in FIG. 3c, illustrates that the optical processing equipment will see the frame 205 as well as both the first inner frame 210 and the second inner frame 220. The exposure of the photoresist can occur sequentially (for example, a first exposure with the horizontally oriented polarized light followed with a second exposure with the vertically oriented polarized light) or simultaneously with both the horizontally oriented polarized light and the vertically oriented polarized light being on at the same time. One technique of simultaneously using both horizontally oriented and vertically oriented polarized light is commonly referred to as quadrupole illumination. Other illumination schemes for simultaneous exposure of horizontally oriented polarized light and vertically oriented polarized light are possible.

When both the first inner frame 210 and the second inner frame 220 are a part of the overlay target, it is possible to measure the presence of shifts in the overlay target by comparing the relative positions of the first inner frame 210 to the second inner frame 220 in addition to comparing their relative positions to the frame 205.

The use of both horizontally oriented polarized light and vertically oriented polarized light can be used to detect overlay shifts induced by lens aberrations. When both orientations of polarized light are used, such as in a double exposure scheme, tool induced shifts may occur between the exposure of the horizontally oriented polarized light and the vertically oriented polarized light. The presence of these shifts can be detected by comparing the first inner frame 210 and the second inner frame 220.

Figure 4:
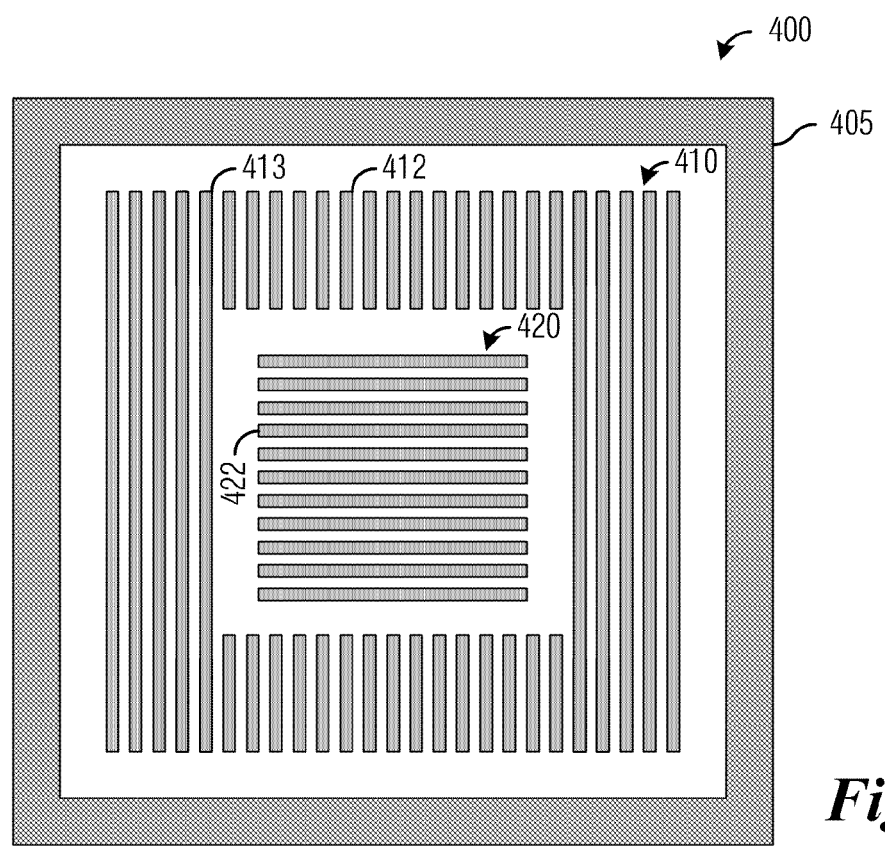
FIG. 4 is a diagram of a composite mask for forming an alternate overlay target, according to a preferred embodiment of the present invention.

With reference now to FIG. 4, there is shown a diagram illustrating a composite mask for forming an alternate overlay target 400, according to a preferred embodiment of the present invention. The composite mask for the overlay target 400 comprises a frame 405, an inner frame 410, and an inner box 420. The frame 405 can be formed on a reference layer, such as a first layer created on a semiconductor wafer, or on any layer created prior to a layer that makes use of the overlay target 400. The inner frame 410 can be formed from a plurality of vertically oriented components, such as a short vertical component 412 and a long vertical component 413. The inner box 420 can be formed from a plurality of horizontal components, such as horizontal component 422, with each component having substantially the same dimensions. The components forming the inner frame 410 and the components forming the inner box 420 should be aligned so that they are orthogonal with respect to one another. Although the diagram illustrates the inner frame 410 being formed from vertical components and the inner box 420 being formed from horizontal components, the inner frame 410 may be formed from horizontal components and the inner box 420 may be formed from vertical components without affecting the scope or spirit of the present invention. For use in patterning a poly layer in a 45 nanometer fabrication process, the components of the inner frame 410 and the inner box 420 should have a width of about 60 nanometers and a pitch of about 140 nanometers. The width and/or pitch of the components can differ depending upon the layer being patterned as well as the fabrication technology.

As in the overlay target 200 (FIG. 2), with the overlay target 400, the nature of the polarized light in the lithography determines the use of the inner frame 410 or the inner box 420. As shown in FIG. 4, if vertically oriented polarized light was used in the lithography process, then the inner frame 410 would be patterned onto the photoresist layer, and the inner box 420 would be patterned onto the photoresist layer if horizontally oriented polarized light was used in the lithography process. If unpolarized light (or polarized light with orientation other than vertical or horizontal) were used in the lithography process, then both the inner frame 410 and the inner box 420 would be patterned onto the photoresist layer and both can be used in the alignment process.

Other embodiments of overlay targets are possible. As discussed previously, it is possible to switch the orientation of the components of the first inner frame 210 and the second inner frame 220 (both from FIG. 2) and the inner frame 410 and the inner box 420 (both from FIG. 4). However, the orientation of the components should be set so that the components are orthogonal to each other. The dimensions of the components can be varied. For example, with a frame or box, the width and/or pitch of the components can vary rather than staying consistent. Additionally, if polarized light with more than two orientations are to be used in the lithography process, then the overlay target can contain more than two inner frames or inner frames/inner boxes, with the orientation of components in the inner frames/inner boxes being set so that they are in-line with the polarity of the polarized light.

Figure 5:
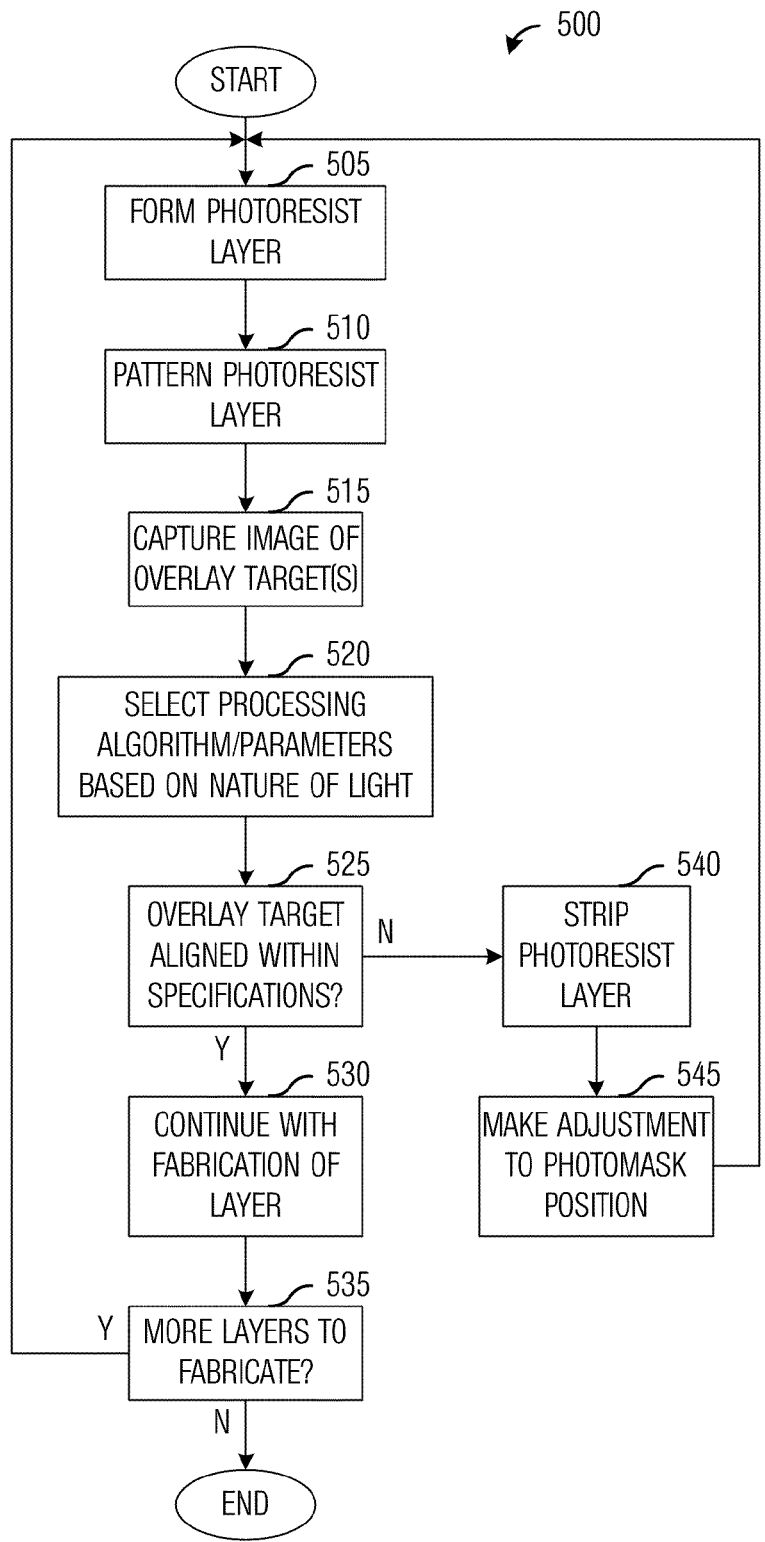
FIG. 5 is a diagram of an algorithm for aligning layers using the overlay target of FIG. 2 and FIG. 4, according to a preferred embodiment of the present invention.

With reference now to FIG. 5, there is shown a diagram illustrating an algorithm 500 for use of an overlay target to align layers of an integrated circuit during fabrication, according to a preferred embodiment of the present invention. The algorithm 500 makes use of an overlay target that contains elements that are specially designed for use with polarized light, such as the overlay target 200 (FIG. 2) and the overlay target 400 (FIG. 4). These overlay targets have different portions that would be present or absent dependent upon a specific polarization of polarized light, such as vertical or horizontal, used during the patterning of the photoresist layer. The algorithm 500 may be descriptive of actions performed by a semiconductor fabrication process during the patterning of layers on a semiconductor wafer.

The fabrication process can begin with the application of a photoresist layer on a semiconductor substrate (block 505). The semiconductor substrate may or may not have other layers previously formed. Once the photoresist layer has been applied, it can be patterned using a photomask (block 510). The patterning may be performed using light of a desired polarity and depending upon the polarity of the light used in the patterning, different portions of the overlay target can be patterned on the photoresist layer. For example, referring to the overlay target 200 (FIG. 2), if polarized light with a vertical orientation is used in the patterning of the photomask, then the first inner frame 210 is patterned on the photoresist layer but the second inner frame 220 is not.

After the photoresist has been patterned (block 510), an image of the overlay target(s) can be captured (block 515). The image may be made by a portion of an overlay metrology tool. The image capture can take place in one step in a manner similar to taking a picture or the image capture can occur using a sequential scanning process, similar to an optical scanner moving across a field.

The image can then be processed by image processing algorithms to determine the alignment of the layer to be fabricated, based upon a reference layer (block 520). The image processing algorithm and/or image processing parameters can be different based upon the nature of the polarized light used in the patterning. For example, if the overlay target 200 (FIG. 2) was used in the alignment process, then the image processing parameters can differ based on the orientation of the polarized light, with the parameters changing to process a change in expected position of an inner frame. However, if the overlay target 400 (FIG. 4) was used in the alignment process, then the image processing algorithm can differ based upon the orientation of the polarized light, with the algorithm changing to either process a frame or a box.

The image processing algorithm can provide a numerical answer that provides an indication of the alignment of the layer to be fabricated with respect to the reference layer. A decision can then be made regarding the alignment of the layer to be fabricated (block 525). If the overlay target is aligned within specifications, then the fabrication of the layer to be fabricated can be continued (block 530). This can include the etching of the photoresist patterns, the washing off the unexposed portions of the photoresist, the deposition of the structures in the layer to be fabricated, and so forth. After the layer to be fabricated has been completed, if additional layers are to be fabricated (block 535), the fabrication process can return to block 505 to initiate the fabrication of the next layer. If no more layers are to be fabricated, then the fabrication process can terminate.

If the overlay target is not aligned within specifications, then the photoresist layer is stripped (block 540). After the photoresist layer is removed, an adjustment can be made to the position of the photomask (block 545). The adjustment to the position of the photomask can be made based upon the results of the image processing algorithm. The photoresist layer can be reapplied (block 505) and the patterning and alignment process can repeat.

In certain situations, a single layer can be patterned with multiple photomasks. The use of polarized light and the overlay target of the present invention can be applicable to the use of multiple photomasks to pattern a single layer. An exemplary sequence of events in the use of multiple photomasks to pattern a single layer can be as follows: a) align photomask #1, b) align wafer, c) pattern with a polarized light of a first orientation, d) align photomask #2, and e) pattern with a polarized light of a second orientation, wherein the alignment of the photomasks can be achieved using an alignment algorithm, such as the algorithm 500 (FIG. 5).

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A mask for forming a bullet portion of an overlay target, the mask comprising:
   a first structure on the mask formed from a first plurality of sub-structures, all oriented along a first orientation; and
   a second structure on the mask encompassed by the first structure, the second structure being formed from a second plurality of sub-structures, all oriented along a second orientation, wherein the second orientation is different from the first orientation.

2. The mask of claim 1, wherein the first orientation is orthogonal to the second orientation.

3. The mask of claim 1, wherein the sub-structures in the first plurality of sub-structures have substantially equal width and pitch, wherein the sub-structures in the second plurality of sub-structures have substantially equal width and pitch.

4. The mask of claim 3, wherein the sub-structures in the first plurality of sub-structures and the sub-structures in the second plurality of sub-structures have substantially equal width and pitch.

5. The mask of claim 1, wherein the bullet is contained within a frame, and wherein the frame is formed on a layer that is formed prior to a layer containing the first structure and the second structure.

6. The mask of claim 5, wherein the first structure is a rectangular frame and the second structure is a rectangular frame.

7. The mask of claim 5, wherein the first structure is a rectangular frame and the second structure is a rectangular box.

8. The mask of claim 1, wherein the first structure and the second structure block light passage when illuminated with a polarized light with an orientation that is orthogonal to either the first orientation or the second orientation.

9. The mask of claim 1, wherein the overlay target is used in a manufacturing process using polarized light lithography.

10. The mask of claim 4, wherein the dimensions of width and pitch are kept close to design rules of the layer being patterned.

11. A mask for forming a bullet portion of an overlay target, the mask comprising:
a frame on the mask formed from a first plurality of columns, all oriented along a first orientation; and
a structure on the mask within the frame, the structure being formed from a second plurality of columns, all oriented along a second orientation, wherein the second orientation is different from the first orientation.

12. The mask of claim 11, wherein the first orientation is orthogonal to the second orientation.

13. The mask of claim 11, wherein the columns in the first plurality of columns have substantially equal width and pitch, wherein the columns in the second plurality of columns have substantially equal width and pitch.

14. The mask of claim 13, wherein the columns in the first plurality of columns and the columns in the second plurality of columns have substantially equal width and pitch.

15. The mask of claim 11, wherein the structure is a rectangular frame or a rectangular box.

16. The mask of claim 11, wherein the plurality of first columns comprise a plurality of first short columns and a plurality of first long columns and wherein the plurality of first short columns are arranged between the plurality of first long columns.

17. The mask of claim 11, wherein the plurality of second columns comprise a plurality of second short columns and a plurality of second long columns and wherein the plurality of second short columns are arranged between the plurality of second long columns.

18. A mask for forming a bullet portion of an overlay target, the mask comprising:
a first plurality of columns on the mask, the first plurality of columns all oriented along a first orientation, the first plurality of columns having long columns and short columns, the first plurality of columns forming a rectangular structure wherein the outer columns of the rectangular structure are the long columns and the inner columns of the rectangular structure are the short columns; and
a second plurality of columns on the mask, wherein the second plurality of columns are arranged within the first plurality of columns forming the rectangular structure.

19. The mask of claim 18, wherein the columns of the first plurality of columns have substantially equal width and pitch, wherein the columns in the second plurality of columns have substantially equal width and pitch.

20. The mask of claim 18, wherein the second plurality of columns form a rectangular structure or a rectangular box.

* * * * *